United States Patent
Fette

(10) Patent No.: US 7,253,755 B1
(45) Date of Patent: Aug. 7, 2007

(54) HIGH DYNAMIC RANGE ANALOG TO DIGITAL CONVERTER ARCHITECTURE

(75) Inventor: Bruce A. Fette, Mesa, AZ (US)

(73) Assignee: General Dynamics C4 Systems, Inc., Scottsdale, AZ (US)

( * ) Notice: Subject to any disclaimer, the term of this patent is extended or adjusted under 35 U.S.C. 154(b) by 0 days.

(21) Appl. No.: 11/357,553

(22) Filed: Feb. 16, 2006

(51) Int. Cl.
*H03M 1/10* (2006.01)
(52) U.S. Cl. .................. 341/120; 341/118; 341/155
(58) Field of Classification Search ............... 341/97, 341/98, 154, 118, 120, 139, 142, 155; 345/87–89, 345/98
See application file for complete search history.

(56) References Cited

U.S. PATENT DOCUMENTS

| | | | | |
|---|---|---|---|---|
| 4,017,847 A * | 4/1977 | Burford et al. | ............... | 345/46 |
| 4,317,208 A * | 2/1982 | Araseki et al. | ............. | 375/245 |
| 4,890,107 A * | 12/1989 | Pearce | ......................... | 341/156 |
| 6,002,352 A * | 12/1999 | El-Ghoroury et al. | ...... | 341/139 |
| 6,031,481 A * | 2/2000 | Craven | ........................ | 341/200 |
| 6,137,809 A * | 10/2000 | Martinez et al. | ............. | 370/503 |
| 6,373,478 B1* | 4/2002 | Steffensmeier | ............... | 345/204 |
| 6,535,189 B1* | 3/2003 | Akiyama et al. | ............. | 345/87 |
| 6,590,513 B2* | 7/2003 | Stetson et al. | ............... | 341/143 |
| 6,750,839 B1* | 6/2004 | Hogan | ......................... | 345/98 |
| 6,834,260 B2 | 12/2004 | Golden et al. | | |
| 2002/0186231 A1* | 12/2002 | Kudo | ......................... | 345/690 |
| 2003/0006921 A1* | 1/2003 | Stetson et al. | ............... | 341/143 |

* cited by examiner

*Primary Examiner*—Linh Nguyen
(74) *Attorney, Agent, or Firm*—Ingrassia Fisher & Lorenz, P.C.

(57) ABSTRACT

An analog-to-digital converter ("ADC") architecture as described herein utilizes a digital signal processor having suitably configured waveform prediction logic that can predict expected types of input signals. The ADC architecture subtracts the predictable signal components from the analog input signal prior to the analog-to-digital conversion, which extends the dynamic range of the ADC employed by the ADC architecture. In practice, the ADC architecture can subtract predictable strong signal components from an analog input signal such that the ADC can apply its available dynamic range to the remaining weak signal components.

26 Claims, 3 Drawing Sheets

HIGH DYNAMIC RANGE ANALOG TO DIGITAL CONVERTER ARCHITECTURE

TECHNICAL FIELD

The present invention relates generally to data communication systems. More particularly, the present invention relates to an analog-to-digital converter architecture.

BACKGROUND

The prior art includes many analog-to-digital converter ("ADC") designs. An ADC receives an analog input signal and generates a digital representation of the magnitude of the analog input signal. Any practical ADC exhibits limited dynamic range and spur-free dynamic range. This limit is imposed by the dynamic range of the analog circuitry utilized by the ADC, basic quantum physics related to the quantum noise of the electronic circuits, and the quantization noise associated with the finite number of bits produced by the ADC. Some conventional ADC devices employ a sigma delta technique to extend their dynamic range. Sigma delta techniques predict a sample as being nearly equivalent to the previous sample, and digitally shape the quantization noise to avoid interfering with the desired signal. Sigma delta techniques utilize digital filtering to suppress quantization noise in the region of the signal of interest by constructing a digital feedback path at the frequency of interest. Although sigma delta techniques can improve the dynamic range of a basic ADC design, some applications may have ADC dynamic range requirements that exceed conventional ADC devices that incorporate sigma delta noise feedback.

Accordingly, it is desirable to have an ADC architecture that extends the dynamic range and bandwidth of conventional ADCs. In addition, it is desirable to have an ADC technology that is capable of detecting low power waveforms, and secondary waveforms that may otherwise be "hidden" in a primary or strong waveform. Furthermore, other desirable features and characteristics of the present invention will become apparent from the subsequent detailed description and the appended claims, taken in conjunction with the accompanying drawings and the foregoing technical field and background.

BRIEF SUMMARY

An ADC configured in accordance with an example embodiment of the invention has a high dynamic range relative to conventional ADCs. The ADC described herein extends its dynamic range by measuring, predicting, and subtracting predicable high power waveform components from the signal to be digitized. As a result, the available dynamic range of a finite bit ADC can be applied to the remaining less predicable or lower power signal components. The predicted waveform can be added to the measured waveform, resulting in a representation of the entire composite signal.

The above and other aspects of the invention may be carried out in one form by an ADC architecture comprising an ADC having a positive input for a first analog signal, a negative input for a second analog signal, and an ADC output, where the ADC is configured to generate a first digital output at the ADC output, and the first digital output is generated in response to the first analog signal and the second analog signal; a processor having an input coupled to the ADC output, and having a first output for a digital adjustment signal, where the processor includes a waveform prediction module configured to determine predictable signal characteristics of the first analog signal, and to generate the digital adjustment signal in response to the predictable signal characteristics; and a digital-to-analog converter ("DAC") coupled between the first output of the processor and the negative input of the ADC. The DAC is configured to generate the second analog signal in response to the digital adjustment signal.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that the present invention may be practiced in conjunction with any number of data transmission protocols and that the system described herein is merely one exemplary application for the invention.

For the sake of brevity, conventional techniques related to signal processing, data transmission, analog-to-digital conversion, digital-to-analog conversion, waveform prediction, sigma delta noise feedback, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

Figure 2:
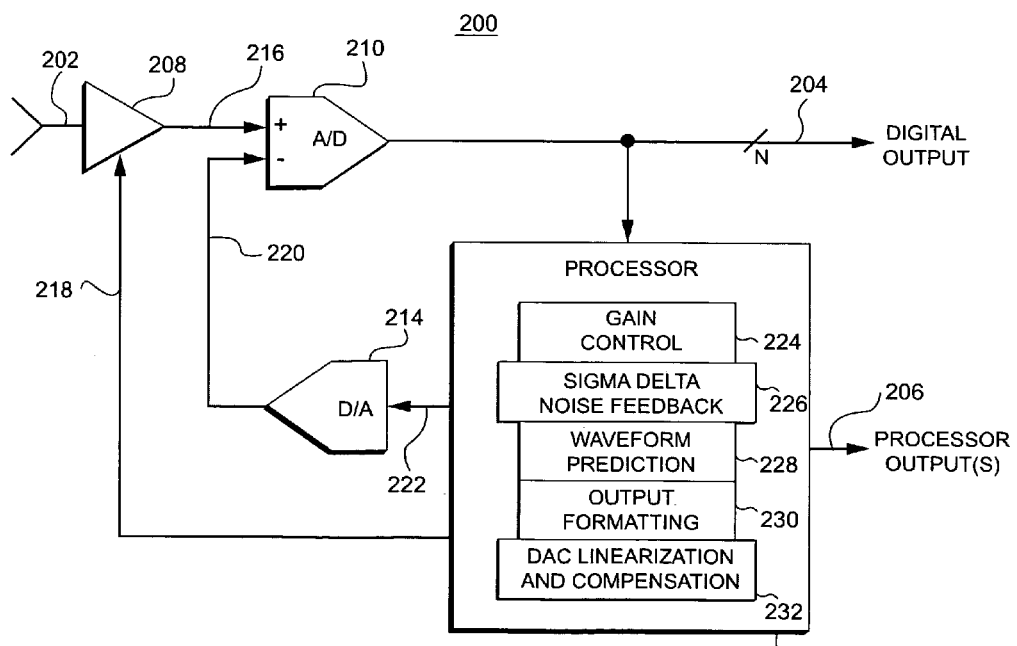
FIG. 2 is a schematic representation of an ADC architecture configured in accordance with an example embodiment of the invention.
Figure 3:
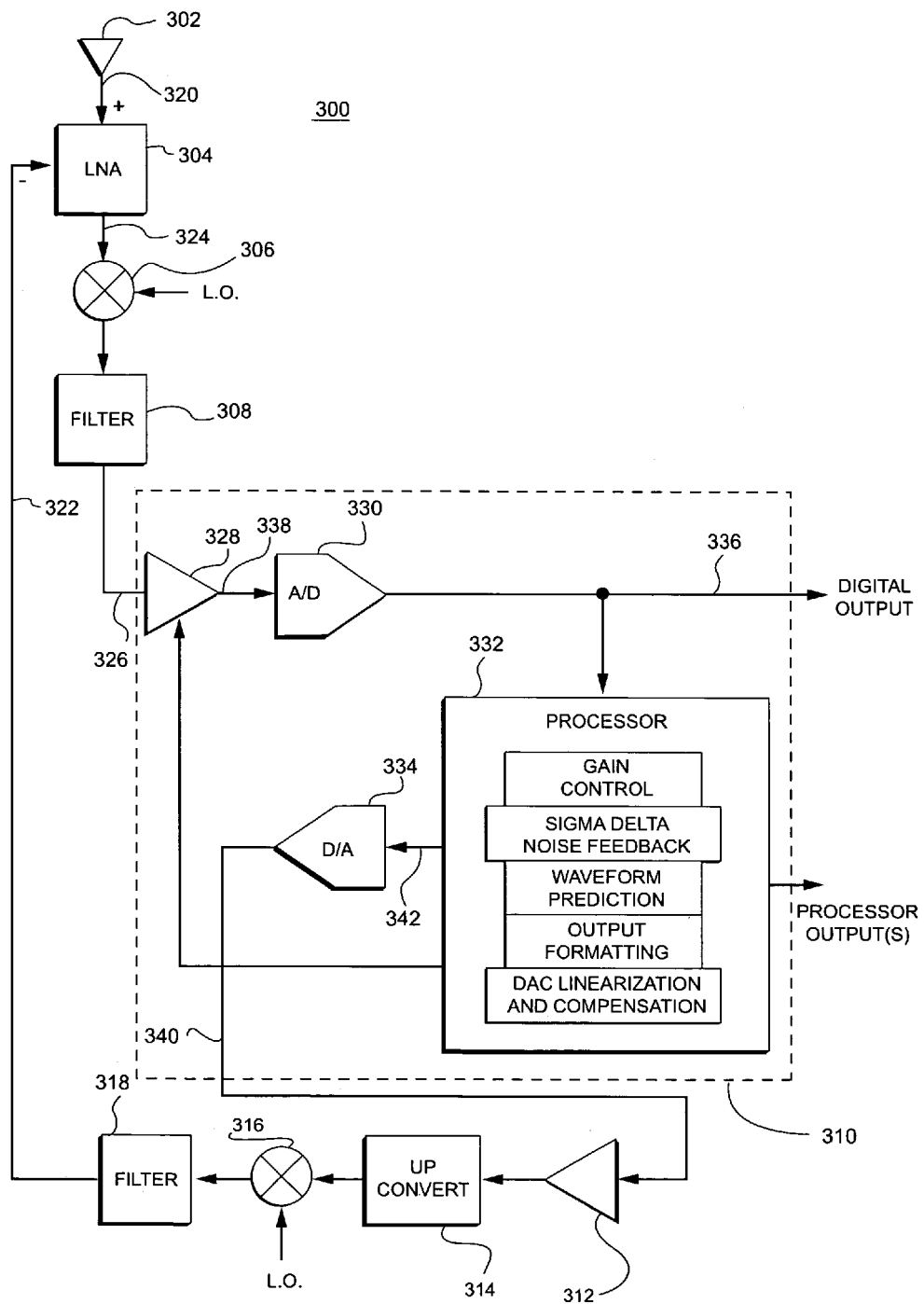
FIG. 3 is a schematic representation of a communication system configured in accordance with an example embodiment of the invention.

The following description refers to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically. Thus, although the schematics shown in FIG. 2 and FIG. 3 depict example arrangements of elements, additional intervening elements, devices, features, or components may be present in actual embodiments (assuming that the functionality of the circuits is not adversely affected).

Those of skill in the art will understand that information and signals may be represented using any of a variety of different technologies and techniques. For example, data, instructions, commands, information, signals, bits, symbols, and chips that may be referenced throughout the following description may be represented by voltages, currents, electromagnetic waves, magnetic fields or particles, optical fields or particles, or any combination thereof.

Figure 1:
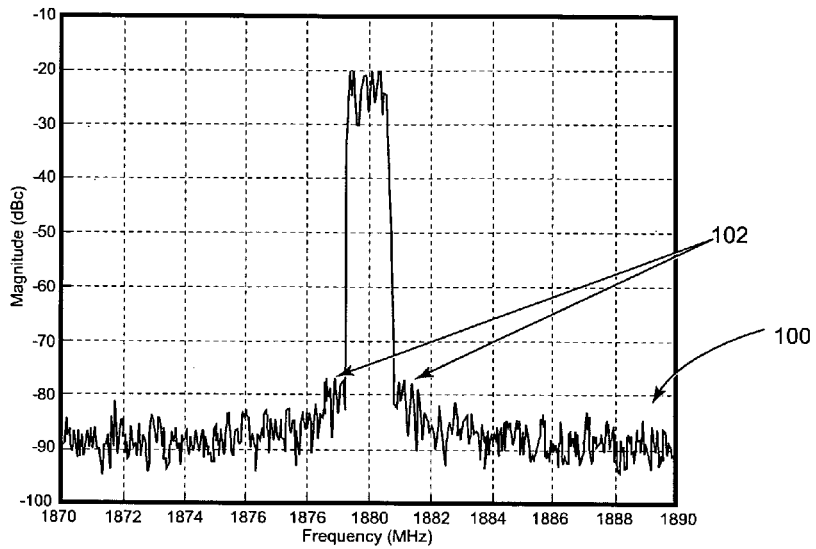
FIG. 1 is a graph of magnitude versus frequency for signal content that may be received by an ADC.

An ADC architecture as described herein is particularly suited for use with analog signals that may be a composite of more than one signal, e.g., signals originating from different sources, signals having different characteristics, a desired signal mixed with noise, or the like. For example, FIG. 1 is a graph of magnitude versus frequency for signal content 100 that may be received by an ADC architecture. Signal content 100 is generally characterized by a carrier frequency of about 1880 MHz and a noise floor that hovers at approximately −90 dBc. Although not a requirement or limitation of the invention, signal content 100 has the characteristics of a typical OFDM waveform, namely, signal content 100 includes a noticeable pedestal of energy (identified by reference number 102) that is a few dBc above the noise floor on either side of the primary energy peak. In practice, however, this pedestal of energy may be caused by a relatively weak received signal component that is in the presence of a relatively strong received signal component. In some practical applications, such as a cellular telephone system where a strong signal may be interfering with a weak signal, it may be desirable to actually receive the weak signal component. An ADC architecture utilized by the cell phone receiver may have difficulty with the weak signal component due to the practical dynamic range limitations of the ADC device.

A standard ADC device has a usable dynamic range of about 60 dB. Thus, it can be difficult to accurately process a weak signal component that is more than 60 dB lower than a strong signal component. An enhanced ADC device that utilizes sigma delta noise feedback techniques may have an extended dynamic range of almost 80 dB. Although this is a measurable improvement over standard ADC devices, some practical applications may require more than 80 dB of dynamic range.

An ADC architecture configured in accordance with an example embodiment of the invention utilizes a traditional ADC device, a gain control device, processing logic that predicts the strong signal components of an input waveform, and a DAC device. The ADC architecture synthesizes the strong waveform components in an appropriate manner such that the strong predictable components can be subtracted from the input signal prior to digitization. The prediction procedure may employ estimation or prediction software that is specifically configured according to certain known types of strong signal interference. For example, in radar applications, the prediction algorithm may be suitably configured with the ability to predict a pulse at a given power level and repetition rate. In radio communication applications, the prediction algorithm may be suitably configured with the ability to subtract a strong narrowband continuous wave interference signal (essentially, a sine wave of relatively constant amplitude, frequency, and phase). In speech communication applications, the prediction algorithm may be suitably configured with the ability to determine and subtract the predicable parts of a speech waveform from a nearby speaker, such that the speech waveform from a distant speaker can also be accurately captured.

In practical embodiments, the first samples of the strong signal component cannot be accurately predicted because the ADC architecture has little or no a priori knowledge of the input signal characteristics. Accordingly, an ADC architecture configured in accordance with a practical implementation of the invention may perform a very brief training or initialization procedure to ensure that the strong signal component is accurately predicted. In addition, the input gain of the ADC architecture may be adjusted to prevent overflow. The ADC architecture may utilize a standard 14-bit ADC device, and the output of the ADC device may be registered into an overall output word having a larger number of bits (for example, 20 bits). In operation, as the digital circuitry becomes aware of what types of strong waveforms might be present (and, therefore, might be predictable), the circuitry begins to update magnitude, frequency, phase, pulse repetition frequency ("PRF") rate, or other signal properties on locally strong signals, and begins to predict those waveform components. As it predicts them, the ADC architecture synthesizes those waveform components in magnitude and phase so as to be able to subtract those components from the incoming signal, allowing the remaining unpredicted components to be converted into the digital domain with higher gain and, consequently, better resolution.

From an output perspective, the digital circuitry of the ADC architecture may arrange to add the predicted component to the unpredicted component, resulting in a larger overall dynamic range output. In one practical embodiment, utilization of the ADC techniques described herein can extend the dynamic range of an ADC device by up to 30 dB. Alternatively, the digital circuitry may simply output the residue, or it may output the predicted parameters as desired to suit the needs of the particular application.

FIG. 2 is a schematic representation of an ADC architecture 200 configured in accordance with an example embodiment of the invention. ADC architecture 200 is suitably configured to process an incoming analog signal 202, generate a digital output 204, and (optionally) generate any number of additional outputs 206. Incoming analog signal 202 may be a signal that is based upon or is otherwise derived from a received signal (such as a received wireless data communication signal, a received cellular telephone signal, a received radar signal, or the like). For the sake of brevity and simplicity, FIG. 2 does not depict any front end receiver components that may be utilized in a practical embodiment. Digital output 204 may include any number (N) of bits, where the actual number of bits may depend upon the particular application or system environment. For example, ADC devices typically provide an output of 14 bits, and digital output 204 may include 14 bits for compatibility with practical digital circuit architectures. Additional outputs 206, which are described in more detail below, may be generated by the processor employed by ADC architecture 200 in response to digital output 204. Briefly, additional outputs 206 may include, without limitation: a supplemental digital output; data indicative of one or more characteristics or features of incoming analog signal 202, digital output 204, or ADC architecture 200; status information for ADC architecture 200; features of the predicted signals such as phase, frequency, or magnitude; modulated properties such as PRF or duty cycle; frequency or amplitude modulation properties of the predicted waveforms; spread spectrum properties of the predicted waveforms; the sum of the predicted waveforms and the residual waveform; only the predicted waveforms; and only the residual waveform. Digital output 204 and additional output 206 may be processed by the system or subsystem in which ADC architecture 200 resides.

ADC architecture 200 generally includes a programmable gain element 208, an ADC 210, a processor 212, and a DAC 214. Programmable gain element 208 includes an input for a received analog signal, such as incoming analog signal 202, and programmable gain element 208 is suitably configured to generate a first analog signal 216 from the received analog signal. Programmable gain element 208 may function as an adjustable attenuator and/or an adjustable gain amplifier, such that the magnitude of incoming analog signal 202 can be adjusted to ensure that ADC 210 is not overdriven. In the example embodiment, programmable gain element 208 includes a control signal input for a gain control signal 218 generated by processor 212. In practical embodiments, gain control signal 218 may be a digital signal having any number of bits. For example, 30 dB of gain control range may be suitable for some common applications. If the gain control is configured in 1 dB steps, then it is feasible to control the gain with five control bits. If, however, the system employs 6 dB steps such that the shifting of the signal up and down the databus corresponds to one-bit steps (and to maintain consistency across gain changes), then three control bits are sufficient to provide the 30 dB control range.

Programmable gain element 208 includes an output that is coupled to a positive input of ADC 210. Thus, first analog signal 216 serves as one input to ADC 210 in this example. ADC 210 also includes a negative input for a second analog signal 220, and an ADC output. In the example embodiment shown in FIG. 2, ADC 210 generates digital output 204 at the ADC output. ADC 210 is suitably configured to generate digital output 204 in response to first analog signal 216 and second analog signal 220. In particular, ADC 210 is configured to generate a digital representation of a magnitude that corresponds to the magnitude of first analog signal 216 minus the magnitude of second analog signal 220. In other words, ADC 210 subtracts second analog signal 220 from first analog signal 216, then performs an analog-to-digital conversion on the difference (alternatively, ADC architecture 200 may utilize a separate subtraction element that is not integrated with ADC 210). In the context of one practical embodiment, first analog signal 216 comprises a strong signal component combined with a weak signal component, second analog signal 220 comprises a predicted representation of the strong signal component, and digital output 204 comprises a digital representation of an estimation of the weak signal component. ADC circuits are well known to those skilled in the art and, therefore, the circuit topology of ADC 210 and the manner in which ADC 210 quantizes the analog difference signal will not be described in detail herein.

As mentioned above, digital output 204 may serve as an output of ADC architecture 200. In addition, digital output 204 may serve as an input to processor 212. Processor 212 generally includes an input coupled to the output of ADC 210, a first output (coupled to the input of DAC 214) for a digital adjustment signal 222, a second output (coupled to programmable gain element 208) for gain control signal 218, and a third output for processor output(s) 206. Processor 212 may include one or more processing modules having suitably configured processing logic and/or software, such as, without limitation: a gain control module 224; a sigma delta noise feedback module 226; a waveform prediction module 228; an output formatting module 230; and a DAC linearization and compensation module 232. Each of these modules is described in more detail below. In practice, the various illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. Processor 212 may be realized as a digital signal processor, a microprocessor, a controller, a microcontroller, or a state machine. Processor 212 may also be implemented as a combination of computing devices, e.g., a combination of a digital signal processor and a microprocessor, a plurality of microprocessors, one or more microprocessors in conjunction with a digital signal processor core, or any other such configuration.

Briefly, waveform prediction module 228 is appropriately configured to determine predictable signal characteristics of incoming analog signal and/or first analog signal 216, and to generate digital adjustment signal 222 in response to those predicable signal characteristics. In the context of the above example, waveform prediction module 228 may be configured to predict a feature of the strong signal component contained in first analog signal 216, such as the magnitude of the strong signal component.

DAC 214 may be coupled between the first output of processor 212 and the negative input of ADC 210. In practical embodiments, DAC 214 is configured to generate second analog signal 220 in response to digital adjustment signal 222. In particular, DAC 214 is configured to generate an analog signal having a magnitude that corresponds to a magnitude indicated by digital adjustment signal 222. DAC circuits are well known to those skilled in the art and, therefore, the circuit topology of DAC 214 and the manner in which DAC 214 generates second analog signal 220 from digital adjustment signal 222 will not be described in detail herein.

Referring again to processor 212, gain control module 224 is suitably configured to generate gain control signal 218 in a format that is compatible with programmable gain element 208. In practical embodiments, gain control module 224 includes processing logic that performs overload detection and automatic gain control for ADC architecture 200. For example, if gain control module 224 either halves or doubles the gain of programmable gain element 208, then the output of ADC would be bit-shifted to the right or left by one bit. This enables ADC architecture 200 to perform such gain adjustments without adversely impacting the interpretation of the digitized output from a system perspective. Gain control module 224 can also increase the gain of programmable gain element 208 to obtain better resolution for low energy signals.

Sigma delta noise feedback module 226 is configured to carry out conventional sigma delta noise feedback techniques to extend the dynamic range of ADC architecture 200. The waveform prediction algorithm utilized by processor 212 builds upon the predictive technique performed by sigma delta noise feedback module 226 to extend the dynamic range of ADC architecture even further.

Waveform prediction module 228 utilizes one or more algorithms to predict certain characteristics of incoming signal samples such that the predictable signal components can be effectively subtracted from first analog signal 216. If the predicable signal characteristics correspond to a strong signal component in a composite input signal, then the subtraction of the strong signal component frees up the dynamic range of ADC 210, and that dynamic range can then be devoted to the weaker signal component. For example, if ADC architecture 200 is utilized to digitize radar pulse signals, and waveform prediction module 228 determines that there is a predictable pulse width and periodicity, then ADC architecture 200 can assume that a periodic strong pulse will be received. Waveform prediction module 228 can characterize certain features of the pulse, including a predicted magnitude, which can be subtracted from the incoming analog radar signal. The residual analog signal will be a relatively low magnitude signal, which enables ADC architecture 200 to process signals that might otherwise be treated as noise. In practice, waveform prediction module 228 analyzes historical trends in the received signal (as represented by digital output 204), which makes ADC architecture 200 particularly suited for use in applications having cyclical or otherwise predictable signals.

Waveform prediction module 228 may be configured to characterize and/or predict certain features of the signal under observation. For example, waveform prediction module 228 may analyze the spectrum of a received signal and monitor for strong sine wave components. If waveform prediction module 228 detects a particular sine wave, processor 212 can measure the frequency, phase, and amplitude of the sine wave, and generate a digital representation of a sine wave that is equal in amplitude and frequency, yet 180 degrees out of phase relative to the detected sine wave. That synthesized sine wave can be utilized to produce the second analog signal 220 to effectively cancel the detected sine wave from first analog signal 216. In practical embodiments, waveform prediction module 228 operates in a feedback path that monitors digital output 204 to improve the accuracy of the predictive modeling over time.

Waveform prediction module 228 may also be configured to "extract" certain features of the incoming signal or signals, and processor 212 can represent the incoming signal or signals in terms of such features. For example, waveform prediction module 228 may detect, analyze, and/or process any of the following features, without limitation: frequency; phase; amplitude; pulse width; pulse shape; timing characteristics; carrier frequency; features of the predicted signals such as phase, frequency, or magnitude; modulated properties such as PRF or duty cycle; frequency or amplitude modulation properties of the predicted waveforms; spread spectrum properties of the predicted waveforms; the sum of the predicted waveforms and the residual waveform; only the predicted waveforms; and only the residual waveform. In practical embodiments, waveform prediction module 228 is customized to accommodate the intended application and to accommodate the types of signals contemplated by the intended application. Moreover, the waveform prediction algorithms may need to be customized or programmed with features, parameters, and/or characteristics that are specific to the intended application to enable ADC architecture 200 to quickly and effectively predict the desired signal components.

As described above, an extracted feature may be the magnitude of a strong signal component, and waveform prediction module 228 could be configured to generate a digital representation of that magnitude for use as an input to DAC 214 and/or for use as a secondary output 206. Such secondary output 206 can be combined with digital output 204 to provide an overall digital output having more bit resolution than ADC 210 alone. Likewise, waveform prediction module 228 may be suitably configured to generate a respective output that is indicative of any of the features mentioned above. Such output may be processed internally by ADC architecture 200 and/or made available as a secondary output 206 of processor 212.

A practical implementation of ADC architecture 200 may leverage existing waveform prediction algorithms and techniques. For example, waveform prediction module 228 may utilize auto-regressive moving average modeling techniques, which are particularly suitable for speech and acoustic signals. Other algorithms, techniques, and methodologies suitable for use with waveform prediction module 228 include, without limitation: Fourier Analysis; autocorrelation; correlation with stored examples; Autoregressive Moving Average ("ARMA"); linear prediction ("LPC"); periodogram; and hotelling.

Output formatting module 230 is configured to generate appropriate outputs for ADC architecture 200. For example, output formatting module 230 is configured to generate digital adjustment signal 222 and gain control signal 218. Moreover, output formatting module 230 can be instructed to analyze extracted features (described above) and produce output data, signals, or information that is formatted in a usable manner. In this regard, output formatting module 230 may be designed to provide an additional digital output corresponding to the digital representation of the subtracted signal component, and that additional digital output may be combined with digital output 204 to provide a combined or overall digital output for ADC architecture 200.

DAC linearization and compensation module 232 can be employed by practical embodiments to compensate for nonlinearities and/or delay that might be introduced by DAC 214. In practice, module 232 may be activated during an initialization period during which a test signal is injected into ADC architecture 200. The characteristics of the test signal are such that module 232 can accurately characterize the behavior and properties of DAC 214. Thereafter, processor 212 can compensate for the operating characteristics of DAC 214 in connection with the receipt of actual incoming signals. A practical embodiment may utilize known DAC linearization methods, including, without limitation: DC offset removal; first order correction of the gain slope; second order correction for curvature; and nonlinearity correction using one or more lookup tables.

ADC architecture 200 operates in the following manner, assuming that processor 212 has been configured with an appropriate waveform prediction module 228 that is suitable for the particular application. Upon initialization, a practical ADC architecture 200 will enter a very short training period to enable waveform prediction module 228 to detect a predictable signal. For audio signals, the training period is approximately 30 samples or less. For radio signals, the training period is typically less than 100 samples. Assuming a CDMA system with a 6 MHz carrier frequency, ADC architecture will sample at least 12 million samples per second. Thus, the training period is virtually unnoticeable in a practical implementation. Once this training is complete, waveform prediction module 228 will continue to predict the desired signal component in the incoming analog signal 202.

In this example, incoming analog signal 202 includes a strong signal component and a weak signal component. Programmable gain element 208 adjusts the amplitude of incoming analog signal 202 (in accordance with gain control signal 218) to ensure that ADC 210 is not overloaded. The adjusted incoming analog signal 202 corresponds to first analog signal 216 in this example. The second analog signal 220, which represents a predicted or estimated version of the incoming strong signal component, is subtracted from first analog signal 216, and ADC 210 generates digital output 204 in response to the difference signal. Processor 212 monitors the digital output 204 and may update gain control signal 218, digital adjustment signal 222, and/or processor outputs 206 as needed. Digital output 204 represents a digital representation of the weak signal component, and one of the processor outputs 206 may represent a digital representation of the strong signal component, which has been synthesized by processor 212.

The technique described above may also be realized in a receiver architecture that performs the signal subtraction at the RF front end. For example, FIG. 3 is a schematic representation of a communication system 300 configured in accordance with an example embodiment of the invention. Communication system 300 generally includes an antenna 302, an amplifier such as a low noise amplifier 304, a mixer 306, a filter 308, an ADC architecture 310, an amplifier 312, an up-converter 314, a mixer 316, and a filter 318. The elements other than antenna 302 and ADC architecture 310 are associated with the RF front end for communication system 300.

Antenna 302 is configured to receive an incoming analog signal 320 for processing by communication system 300. The incoming analog signal 320 represents a first analog signal for amplifier 304. This signal is received at a positive input to amplifier 304, and a second analog signal 322 is received at a negative input to amplifier 304. In the example embodiment shown in FIG. 3, amplifier 304 generates an output signal 324 that serves as an input to mixer 306. Amplifier 304 is suitably configured to generate its output signal 324 in response to first analog signal 320 and second analog signal 322. In particular, amplifier 304 is configured to generate the amplifier output signal 324 in response to the difference between the magnitude of first analog signal 320 and the magnitude of second analog signal 322. In other words, amplifier 304 effectively subtracts second analog signal 322 from first analog signal 320, then amplifies the difference (alternatively, communication system 300 may utilize a separate subtraction element that is not integrated with amplifier 304).

Mixer 306 and filter 308 operate in accordance with well known receiver design techniques to extract an ADC architecture input signal 326 from the amplifier output signal 324. Notably, ADC architecture input signal 326 is akin to incoming analog signal 202 (see FIG. 2). Indeed, communication system 300 and ADC architecture 200 share a number of features, functions, and elements that will not be redundantly described herein. ADC architecture 310 is similar to ADC architecture 200 in both structure and operation. In particular, ADC architecture 310 includes a programmable gain element 328, an ADC 330, a processor 332, and a DAC 334. In contrast to ADC architecture 200, however, ADC 330 has a single input that is coupled to the output of programmable gain element 328. Consequently, ADC 330 does not perform any signal subtraction, and ADC 330 simply generates digital output 336 in response to amplifier output signal 324 (more specifically, ADC 330 converts its input signal 338 into digital form as digital output 336).

In further contrast to ADC architecture 200, DAC 334 is coupled between processor 332 and the negative input of amplifier 304. More specifically, DAC 334 generates an analog adjustment signal 340 in response to a digital adjustment signal 342 output by processor 332. Analog adjustment signal 340 is processed by amplifier 312, up converter 314, mixer 316, and filter 318 to produce second analog signal 322. In other words, second analog signal 322 is derived from analog adjustment signal 340. Therefore, ADC architecture 310 is suitably configured to identify the predictable signal component and to control the generation of second analog signal 322 such that the predictable signal component can be subtracted in the RF front end, e.g., by amplifier 304. Digital output 336 and the alternative processor outputs can be arranged as described above in connection with ADC architecture 200.

Figure 4:
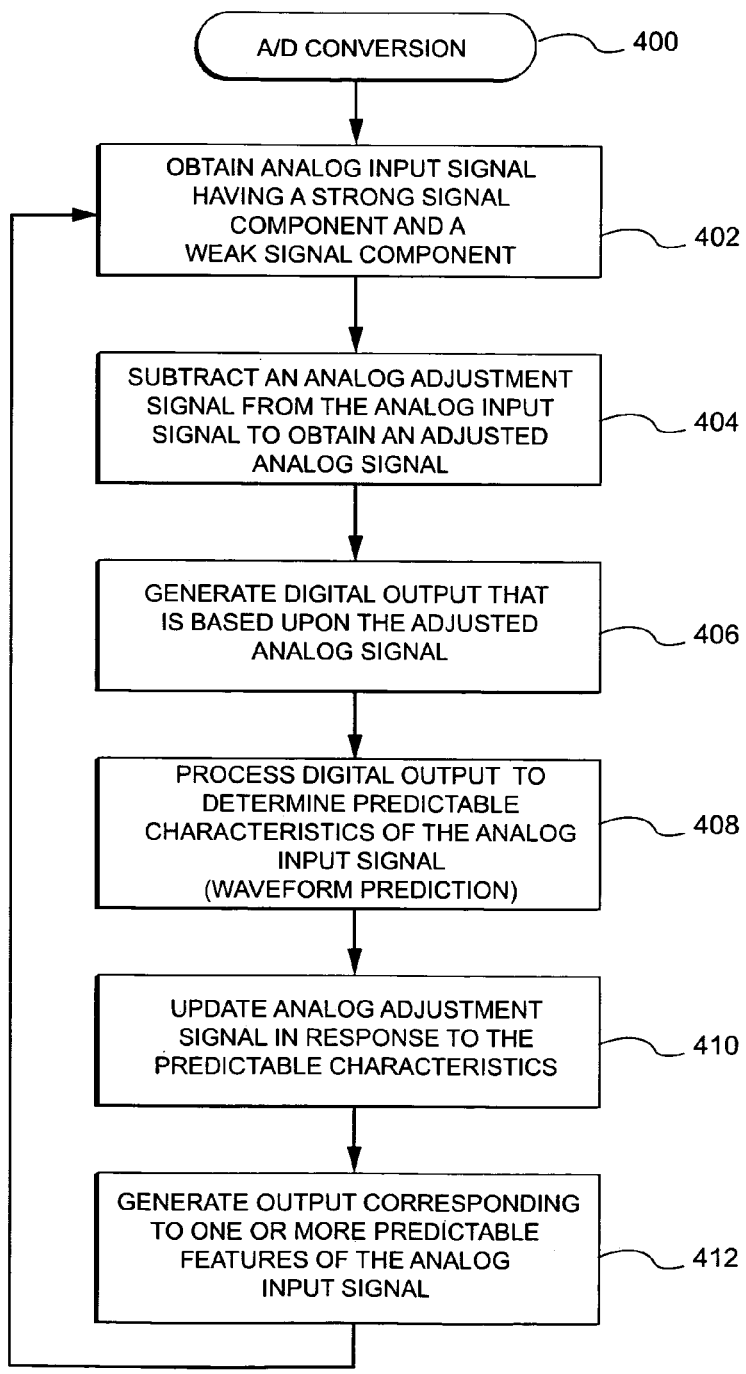
FIG. 4 is a flow chart of an analog-to-digital conversion process according to an example embodiment of the invention.

FIG. 4 is a flow chart of a generalized and simplified analog-to-digital conversion process 400 according to an example embodiment of the invention. Process 400 may be performed by ADC architecture 200, by communication system 300, or by any suitably configured circuit, architecture, arrangement of elements, system, or subsystem. The various tasks performed in connection with process 400 may be performed by software, hardware, firmware, or any combination thereof. For illustrative purposes, the following description of process 400 may refer to elements mentioned above in connection with FIGS. 1-3. In practical embodiments, portions of process 400 may be performed by different elements of the described system, e.g., ADC 210, waveform prediction module 228, or DAC 214. It should be appreciated that process 400 may include any number of additional or alternative tasks, the tasks shown in FIG. 4 need not be performed in the illustrated order, and process 400 may be incorporated into a more comprehensive procedure or process having additional functionality not described in detail herein.

Analog-to-digital conversion process 400 assumes that the receiving device is configured as described above, namely, that the receiving device includes a processor having the processing logic necessary to perform the waveform prediction algorithm(s) for the anticipated signal or signals to be received. As mentioned above, a practical waveform prediction algorithm may have at least some a priori knowledge of certain characteristics, features, or parameters of the signal or signals to be processed. Process 400 may begin by obtaining an analog signal that comprises a first signal component, such as a strong signal component, and a second signal component, such as a weak signal component (task 402). Referring to FIG. 2, this analog input signal may correspond to a preconditioned signal (e.g., signal 202), a gain-adjusted signal (e.g., signal 216), or a signal derived from such signals. Referring to FIG. 3, this analog input signal may correspond to a received RF signal (e.g., signal 320) or a signal derived from such a signal. For purposes of these examples, the analog input signal refers to signal 216 in FIG. 2 and to signal 320 in FIG. 3.

Analog-to-digital conversion process 400 subtracts an analog adjustment signal from the analog input signal, which results in an adjusted analog signal (task 404). In this example, the analog adjustment signal is a predicted representation or estimation of the strong signal component. For ADC architecture 200, task 404 is performed by ADC 210. Alternatively, task 404 may be performed by a suitably configured subtraction element that generates a difference output that is fed to ADC 210. For communication system 300, task 404 is performed by amplifier 304. Alternatively, task 404 may be performed by a suitably configured subtraction element that generates a difference output that is fed to amplifier 304.

The adjusted analog signal obtained by task 404 is then processed to generate a digital output that is based upon the adjusted analog signal (task 406). In practice, task 406 represents a standard analog-to-digital conversion wherein the digital output is a digital representation of a given analog signal (which may be the adjusted analog signal or an analog signal based upon the adjusted analog signal). For ADC architecture 200, the digital output is a digital representation of the adjusted analog signal itself. For communication system 300, however, the digital output is a digital representation of an analog signal that is derived from the adjusted analog signal, namely, signal 338). The number of bits in the digital output may differ from one application to another, depending upon the intended operating specifications and parameters.

Analog-to-digital conversion process 400 can then process the digital output from task 406 to determine predictable signal characteristics of the analog input signal (task 408). As described previously, the receiver device may utilize a suitable waveform prediction algorithm implemented by a digital signal processor to accomplish task 408. Process 400 may then update the analog adjustment signal in response to one or more of the predictable characteristics (task 410). In the practical embodiments described herein, the processor generates a digital adjustment signal in response to the predictable characteristics, and the digital adjustment signal is converted into an analog signal using known digital-to-analog conversion techniques. For ADC architecture 200, the output of DAC 214 serves as the analog adjustment signal, and the updating of the analog adjustment signal is controlled by processor 212 and influenced by DAC 214. For communication system 300, the output of filter 318 serves as the analog adjustment signal, and the updating of the analog adjustment signal is controlled by processor 332 and influenced by various front end components (up-converter 314, mixer 316, and filter 318).

In practical embodiments, analog-to-digital conversion process 400 may generate output corresponding to one or more predicted features of the analog input signal (task 412). For example, task 408 may predict certain features of the strong signal component, such as the magnitude of the strong signal component, and task 412 may generate a digital representation of the magnitude of the strong signal component. This additional output may be combined with the digital output obtained by task 406 (which, in this example, is a digital representation of an estimation of the weak signal component) or otherwise processed by the receiving device, the system, or architecture in an appropriate manner. As another example, task 412 may generate outputs related to certain detected features of the analog input signal, the strong signal component, the weak signal component, or the like, including, but not limited to: pulse shape; pulse width; carrier frequency; phase; and magnitude.

Although not separately depicted in FIG. 4, certain tasks in analog-to-digital conversion process 400 may be bypassed or modified during a training or initialization period of operation. This training period may be desirable to enable the waveform prediction logic to obtain an initial prediction of the analog signal characteristics. For example, during the training period the waveform prediction logic can detect and predict the strong signal component. Accordingly, during the training period process 400 may skip task 404, task 406, and task 412. Once the waveform prediction logic has acquired an estimation of the strong signal characteristics, however, process 400 may continue in its normal operating mode.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention, where the scope of the invention is defined by the claims, which includes known equivalents and foreseeable equivalents at the time of filing this patent application.

What is claimed is:

1. An analog-to-digital converter ("ADC") architecture comprising:

an ADC comprising a positive input for a composite analog signal having a predictable strong signal component combined with a weak signal component, a negative input for a second analog signal, and an ADC output, said ADC being configured to generate a first digital output at said ADC output, said first digital output being generated in response to said composite analog signal and said second analog signal, and said first digital output being a digital representation of the weak signal component;

a processor having an input coupled to said ADC output, and having a first output for a digital adjustment signal, said processor comprising a waveform prediction module configured to determine predictable signal characteristics of said strong signal component, to generate a digital representation of the strong signal component for combining with said first digital output, and to generate said digital adjustment signal in response to said predictable signal characteristics; and a digital-to-analog converter ("DAC") coupled between said first output of said processor and said negative input of said ADC, said DAC being configured to generate said second analog signal in response to said digital adjustment signal.

2. An ADC architecture according to claim 1, further comprising:

a programmable gain element having an input for a received analog signal, an output coupled to said positive input of said ADC, and a control signal input for a gain control signal, said control signal input being coupled to a second output of said processor; wherein said processor comprises a gain control module configured to generate said gain control signal; and said programmable gain element is configured to generate said composite analog signal from said received analog signal.

3. An ADC architecture according to claim 1, said waveform prediction module being configured to predict a feature of said strong signal component.

4. An ADC architecture according to claim 3, said feature comprising the magnitude of said strong signal component, and said waveform prediction module being configured to generate a digital representation of the magnitude of said strong signal component.

5. An ADC architecture according to claim 4, said processor comprising a third output, and said waveform prediction module being configured to generate said digital representation of the strong signal component at said third output.

6. An ADC architecture according to claim 3, said feature comprising the pulse shape of said strong signal component, and said waveform prediction module being configured to generate an output indicative of said pulse shape.

7. An ADC architecture according to claim 3, said feature comprising the carrier frequency of said strong signal component, and said waveform prediction module being configured to generate an output indicative of said carrier frequency.

8. An ADC architecture according to claim 3, said feature comprising the phase of said strong signal component, and said waveform prediction module being configured to generate an output indicative of said phase.

9. An ADC architecture according to claim 3, said feature comprising the pulse width of said strong signal component, and said waveform prediction module being configured to generate an output indicative of said pulse width.

10. An ADC architecture according to claim 1, said first digital output comprising a digital representation of the magnitude of said composite analog signal minus the magnitude of said second analog signal.

11. A communication system including an analog-to-digital converter ("ADC") architecture, said communication system comprising:
    an amplifier having a positive input for a first analog signal, a negative input for a second analog signal, and an amplifier output, said amplifier being configured to generate an output signal at said amplifier output, said output signal being generated in response to said first analog signal and said second analog signal;
    an ADC having an ADC input and an ADC output, said ADC input being coupled to said amplifier output, and said ADC being configured to generate a first digital output at said ADC output, said first digital output being generated in response to said output signal;
    a processor having an input coupled to said ADC output, and having a first output for a digital adjustment signal, said processor comprising a waveform prediction module configured to determine predictable signal characteristics of said first analog signal, and to generate said digital adjustment signal in response to said predictable signal characteristics; and
    a digital-to-analog converter ("DAC") coupled between said first output of said processor and said negative input of said amplifier, said DAC being configured to generate an analog adjustment signal in response to said digital adjustment signal, said second analog signal being derived from said analog adjustment signal.

12. An ADC architecture according to claim 11, said first analog signal comprising a strong signal component and a weak signal component, and said waveform prediction module being configured to predict a feature of said strong signal component.

13. An ADC architecture according to claim 12, said feature comprising the magnitude of said strong signal component, and said waveform prediction module being configured to generate a digital representation of the magnitude of said strong signal component.

14. An ADC architecture according to claim 13, said processor comprising a second output, and said waveform prediction module being configured to generate a second digital output, corresponding to said digital representation, at said second output.

15. An ADC architecture according to claim 11, said first analog signal comprising a strong signal component and a weak signal component, said second analog signal comprising a predicted representation of said strong signal component, and said first digital output comprising a digital representation of an estimation of said weak signal component.

16. An ADC architecture according to claim 11, said output signal of said amplifier being generated in response to a difference between said first analog signal and said second analog signal.

17. An ADC architecture according to claim 11, said amplifier comprising a low-noise amplifier.

18. An analog-to-digital conversion method comprising:
    obtaining a composite analog signal comprising a first signal component and a second signal component;
    subtracting an analog adjustment signal from said composite analog signal, resulting in an adjusted analog signal;
    generating a first digital output based upon said adjusted analog signal;
    determining predictable signal characteristics of said composite analog signal;
    generating a second digital output based upon said predictable signal characteristics;
    combining said first digital output with said second digital output to obtain a digital representation of said composite analog signal; and
    updating said analog adjustment signal in response to said predictable signal characteristics.

19. A method according to claim 18, wherein generating said first digital output comprises generating a digital representation of said adjusted analog signal.

20. A method according to claim 18, wherein generating said first digital output comprises generating a digital representation of a signal derived from said adjusted analog signal.

21. A method according to claim 18, wherein subtracting said analog adjustment signal from said composite analog signal is performed by an analog-to-digital converter.

22. A method according to claim 18, wherein subtracting said analog adjustment signal from said composite analog signal is performed by a front end amplifier.

23. A method according to claim 18, wherein:
    said first signal component is a strong signal component;
    said second signal component is a weak signal component; and
    determining predictable characteristics comprises predicting a feature of said strong signal component.

24. A method according to claim 23, wherein:
    said feature comprises the magnitude of said strong signal component; and
    generating said second digital output comprises generating a digital representation of the magnitude of said strong signal component.

25. A method according to claim 18, wherein:
    said first signal component is a strong signal component;
    said second signal component is a weak signal component;
    said analog adjustment signal is a predicted representation of said strong signal component; and
    said first digital output is a digital representation of an estimation of said weak signal component.

26. A method according to claim 18, said first digital output being a digital representation of the magnitude of said first signal component signal minus the magnitude of said second signal component.

* * * * *